United States Patent
Hagen

(10) Patent No.: US 6,892,058 B2
(45) Date of Patent: May 10, 2005

(54) METHOD AND APPARATUS FOR FACILITATING FAULT TOLERANCE IN A RADIO FREQUENCY AMPLIFIER SYSTEM

(75) Inventor: Rodney Wayne Hagen, Lake In The Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 170 days.

(21) Appl. No.: 10/397,768

(22) Filed: Mar. 26, 2003

(65) Prior Publication Data

US 2004/0192212 A1 Sep. 30, 2004

(51) Int. Cl.[7] .............................................. H04B 17/02
(52) U.S. Cl. ......................... 455/137; 455/8; 455/280; 455/281; 455/282
(58) Field of Search ............................. 455/80, 81, 8, 455/137, 280, 281, 282, 424; 370/210, 208, 335; 330/126; 333/100

(56) References Cited

U.S. PATENT DOCUMENTS

| | | | |
|---|---|---|---|
| 5,742,584 A | * | 4/1998 | Meredith ..................... 370/210 |
| 5,790,517 A | * | 8/1998 | Meredith ..................... 370/210 |
| 5,834,972 A | | 11/1998 | Schiemenz, Jr. et al. |
| 6,292,677 B1 | | 9/2001 | Hagen ......................... 455/572 |
| 6,381,212 B1 | * | 4/2002 | Larkin ......................... 370/210 |

OTHER PUBLICATIONS

Jeff Merrill; "4x4 Hybrid Matrix Power Amplifier"; Wireless Design & Development Oct. 1998.

* cited by examiner

*Primary Examiner*—Lee Nguyen
*Assistant Examiner*—Sanh Phu

(57) ABSTRACT

N input signals are fed (702) to a first Fourier Transform Matrix (FTM) (208) to produce N intermediate signals. Each of the N intermediate signals is split (704) via a non-isolating splitter (300) to produce M split signals. At least one of the M split signals from each of the N intermediate signals is amplified (706) to produce at least N amplified signals. The at least N amplified signals are coupled (708) to N non-isolating combiners (300), each having at least M input ports, to produce N combiner output signals. The N combiner output signals are applied (710) to a second FTM (210) to produce N final output signals.

18 Claims, 6 Drawing Sheets

METHOD AND APPARATUS FOR FACILITATING FAULT TOLERANCE IN A RADIO FREQUENCY AMPLIFIER SYSTEM

FIELD OF THE INVENTION

This invention relates in general to radio frequency (RF) communication systems, and more specifically to a method and apparatus for facilitating fault tolerance in a radio frequency amplifier system.

BACKGROUND OF THE INVENTION

It is well known that a Fourier Transform Matrix (FTM) can be used in a multi-carrier RF communication system for distributing a plurality of RF signals among multiple amplified paths, and for recovering the plurality of RF signals after amplification. Advantages associated with using the FTM include a reduced peak-to-average power requirement for the amplifiers, greater efficiency of amplifier utilization, and a degree of redundancy.

Unfortunately, the redundancy provided by the prior-art FTM technique is not perfect. When a failure occurs in one of the amplified paths, the insertion loss encountered by each of the RF signals is degraded, and the isolation between the RF signals is also degraded. For example, in a 4×4 FTM, if a singular amplified path is disrupted, insertion loss for each RF signal will degrade by approximately 2.5 dB, and the isolation between the RF signals will be reduced substantially—in some cases by 30 to 40 dB.

Thus, what is needed is a method and apparatus for facilitating fault tolerance in an RF amplifier system. The method and apparatus preferably will tolerate a failure in one of the amplified paths with minimal degradation of insertion loss and without producing a substantial reduction in isolation between the RF signals.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF THE PREFERRED EMBODIMENTS

In overview, the present disclosure concerns radio frequency (RF) communication systems. More particularly, various inventive concepts and principles embodied as a method and apparatus for facilitating fault tolerance in an RF amplifier system for use in equipment with such RF communications systems will be discussed and disclosed. The RF communications systems of particular interest are those being deployed and developed such as Integrated Dispatch Enhanced Networks from Motorola, Inc. and cellular systems and evolutions thereof that utilize multi-carrier amplifiers, although the concepts and principles have application in other systems and devices.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in one or more conventional micro-strip circuits, or with conventional microprocessors. It is expected that one of ordinary skill, notwithstanding possibly significant effort and many design choices motivated by, for example, available time, current technology, and economic considerations, when guided by the concepts and principles disclosed herein will be readily capable of programming such microprocessors, or generating such micro-strip circuits with minimal experimentation. Therefore, in the interest of brevity and minimization of any risk of obscuring the principles and concepts according to the present invention, further discussion of such microprocessors and micro-strip circuits, if any, will be limited to the essentials with respect to the principles and concepts employed by the preferred embodiments.

Figure 1:
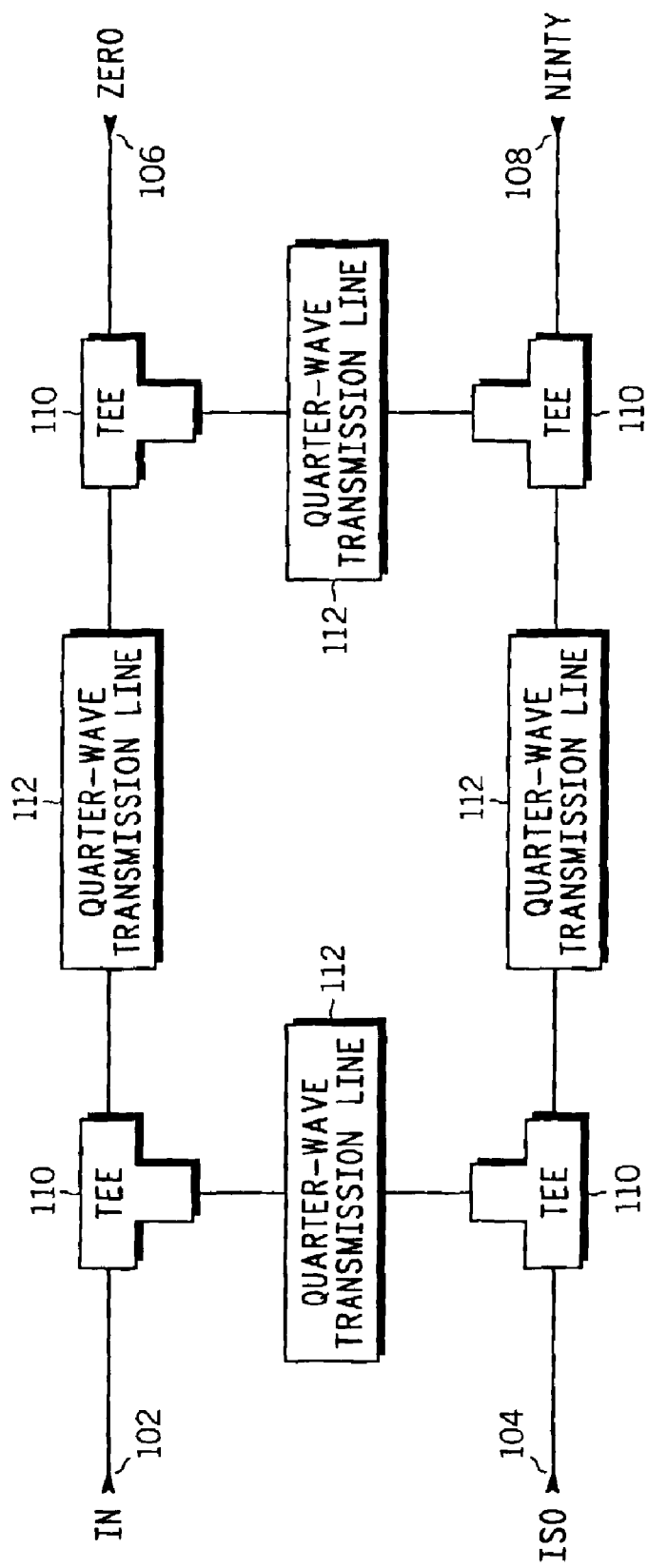
FIG. 1 is one form of an electrical circuit of a prior-art Fourier Transform Matrix (FTM).

Referring to FIG. 1, one form of an electrical circuit of a prior-art basic 2×2 Fourier Transform Matrix (FTM) 100 includes first and second inputs 102, 104 coupled to a plurality of tees 110 and quarter-wave transmission lines 112, arranged as depicted, and having first and second outputs 106, 108. The basic 2×2 FTM 100 is also sometimes referred to as a branch line coupler. It will be appreciated that, alternatively, other forms of FTM circuits can be utilized to produce quadrature signals at the first and second outputs 106, 108. RF amplifier networks comprising FTMs are well-known and have exhibited the advantages and problems discussed briefly in the Background. For further information on the application of FTMs to RF amplifier networks, the reader is referred to "4×4 Hybrid Matrix Power Amplifier" by Jeff Merrill, published October 1998 in *Wireless Design and Development*.

Figure 2:
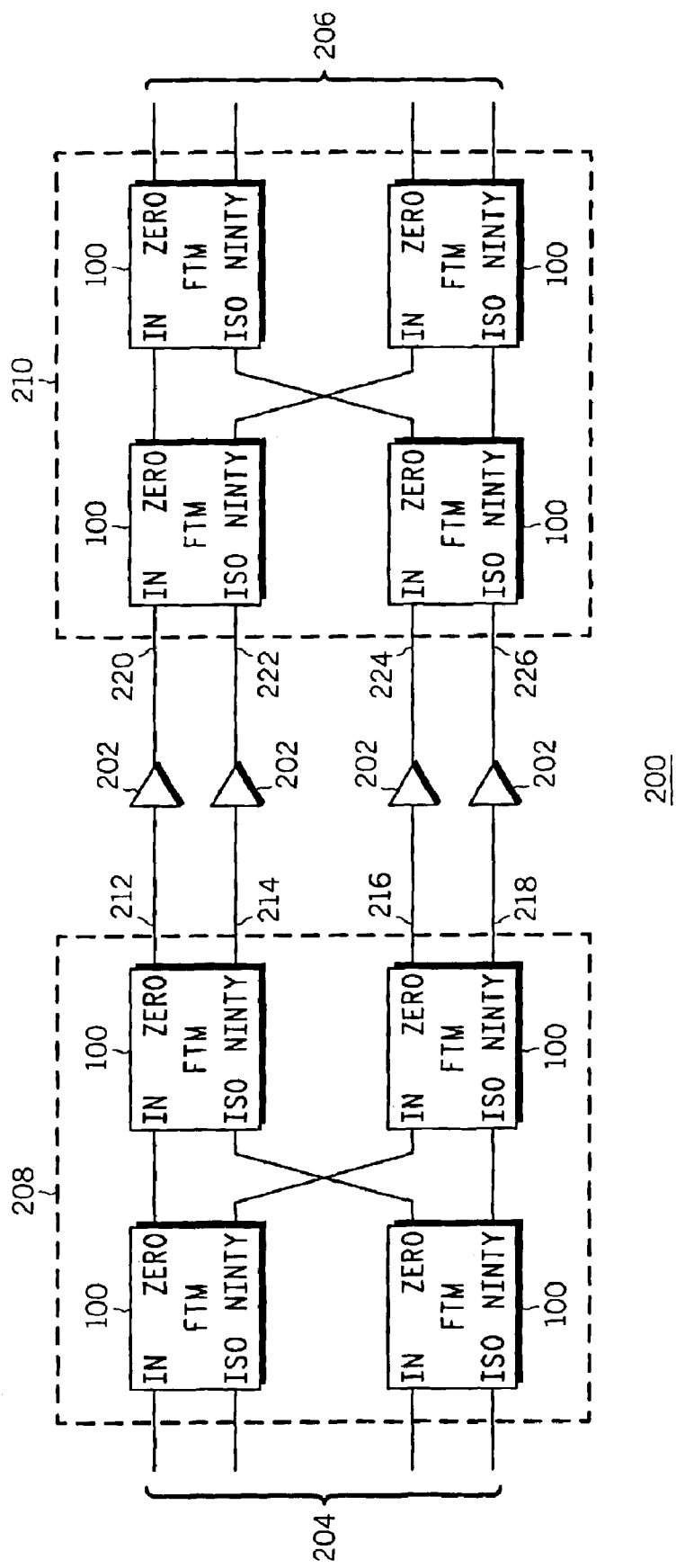
FIG. 2 is an electrical block diagram of a prior-art 4×4 FTM amplifier network.

Referring to FIG. 2, an electrical block diagram of a prior-art 4×4 FTM amplifier network 200 includes a first 4×4 FTM 208 comprising four of the basic FTMs 100 coupled as shown. The first 4×4 FTM 208 includes four FTM inputs 204 for receiving four separate input signals, and further includes four FTM outputs 212–218 producing four intermediate signals. The four FTM outputs 212–218 are coupled, respectively, to four amplifiers 202, whose outputs are coupled, respectively, to four corresponding FTM inputs 220–226 of a second 4×4 FTM 210 comprising another four of the basic FTMs 100 coupled as shown to reproduce the four separate (amplified) input signals at four FTM outputs 206. It is preferred that the four amplifiers 202 have substantially identical insertion phase and gain with respect to one another.

In operation, the first FTM 208 produces the four intermediate signals comprising phase-shifted mixes of the four input signals at the FTM outputs 212–218, while the second FTM 210 converts the four phase-shifted mixes back into the four separate amplified input signals. The amplifiers 202 each amplify one of the four phase-shifted mixes of the four input signals. If one of the amplifiers 202 fails, the four separate amplified input signals will still appear at the FTM outputs 206, but, disadvantageously, with increased insertion loss and reduced isolation between the four signals.

Figure 3:
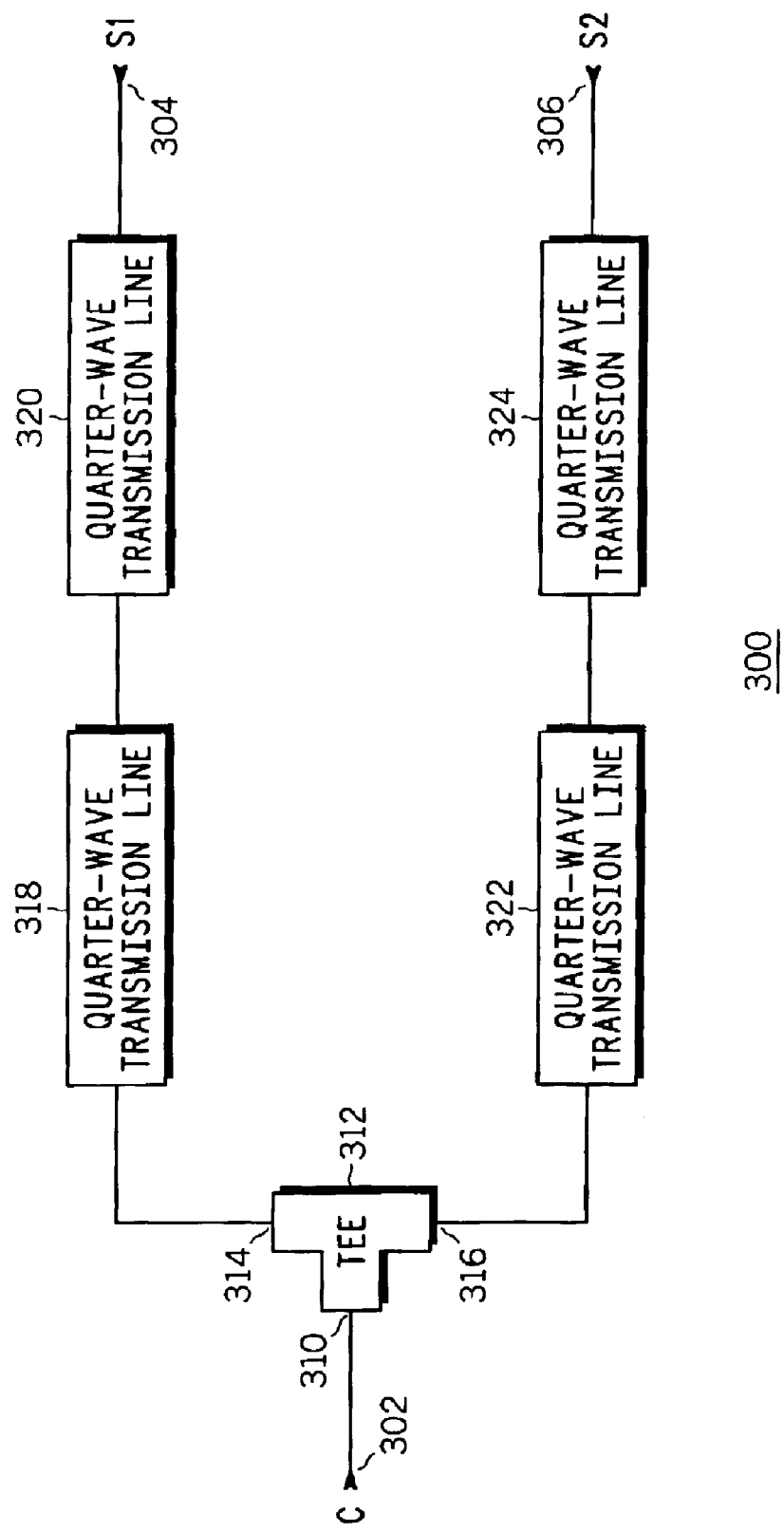
FIG. 3 is one form of an electrical circuit of a prior-art non-isolating splitter/combiner.

Referring to FIG. 3, one form of an electrical circuit of a non-isolating splitter/combiner 300 comprises a "combined" input/output node 302 coupled to the midpoint 310 of a tee 312. A first side 314 of the tee 312 is coupled to a first end of a first quarter-wave transmission line 318. The second end of the first quarter-wave transmission line 318 is coupled to a first end of a second quarter-wave transmission line 320, which is used as a phasing line for reasons described further below. The second end of the second transmission line 320 is coupled to a first "split" input/output node 304. A second side 316 of the tee 312 is coupled to a first end of a third quarter-wave transmission line 322. The second end of the third quarter-wave transmission line 322 is coupled to a first end of a fourth quarter-wave transmission line 324, which is also used as a phasing line. The second end of the fourth quarter-wave transmission line 324 is coupled to a second "split" input/output node 306. It will be appreciated that, alternatively, the first and second quarter-wave transmission lines 318, 320 can be replaced by a single half-wave transmission line, as can the third and fourth quarter-wave transmission lines 322, 324.

An advantage of having one-half wave length of phasing line on each side of the tee 312 is that when a switch coupling an amplifier to one side of the tee 312 is opened, e.g., in response to a failure of the amplifier, the resultant open circuit is reflected back to the tee 312, thereby sending the signals that would have gone to the failed amplifier to a remaining operating amplifier instead. One of ordinary skill in the art will recognize that a transmission line of any even multiple of quarter-wave lengths will produce a similar result. It will be appreciated that, alternatively, a transmission line of any odd multiple of quarter-wave lengths will work as well, if a short circuit is presented by the switch instead of an open circuit after the switch has removed the failed amplifier. It will also be appreciated that the quarter-wave multiples need not be exact, but can be off by a few percent without serious consequences.

The splitter/combiner 300 can be utilized as either a splitter or a combiner, depending on the use of the input/output nodes 302–306. When the "combined" input/output node 302 is used as an input, the splitter/combiner 300 functions as a splitter, producing similar signals at reduced power at the first and second "split" output nodes 304, 306. When the first and second "split" input/output nodes 304, 306 are used as inputs, the splitter/combiner 300 functions as a combiner, producing a sum of the input signals at the "combined" output node 302. For simplification purposes herein below, the splitter/combiner 300 will be referred to as either "the splitter 300" or "the combiner 300," depending upon its application in the portion of the circuit being described. It will be appreciated that, while the splitter/combiner 300 is a two-way splitter/combiner, an M-way splitter/combiner can be utilized as well in accordance with the present invention, where M is an integer greater than 1.

Figure 4:
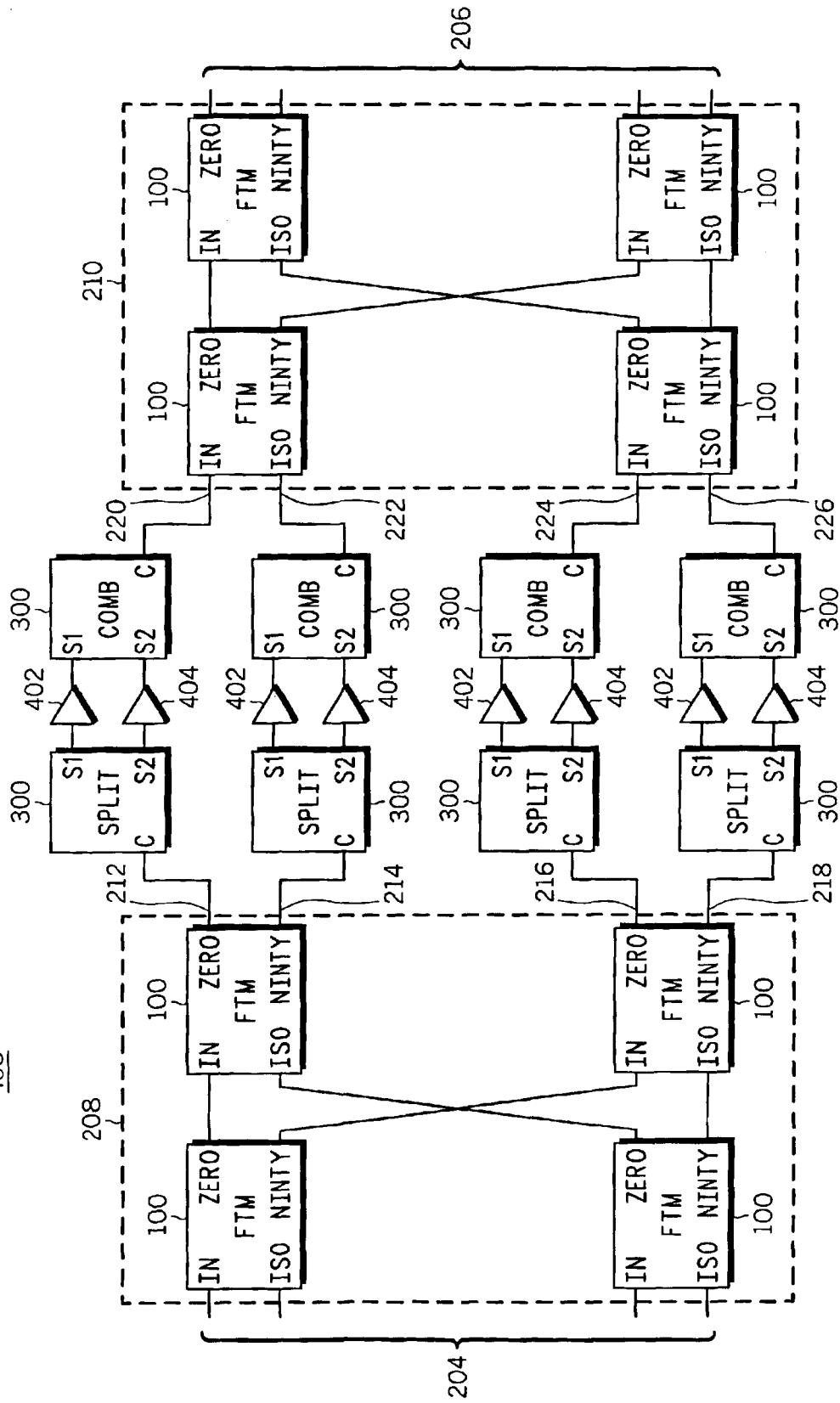
FIG. 4 is an electrical block diagram of an exemplary 4×4 FTM amplifier network in accordance with the present invention.

Referring to FIG. 4, an electrical block diagram of an exemplary and inventive 4×4 FTM amplifier network 400 comprises the first and second 4×4 FTMs 208, 210, as utilized in the prior-art network 200. In the network 400, four of the splitters 300 are coupled to the four outputs 212–218 of the first FTM 208 for splitting each of the four intermediate signals of the four outputs 212–218 to produce two split signals from each of the intermediate signals. The two split signals are coupled to two amplifiers 402, 404, arranged with controllable switches in some embodiments such that the amplifiers 402, 404 can be coupled and uncoupled from the network 400 by a controller 602 (FIG. 6), as described further herein below. The outputs of the two amplifiers 402, 404 produce two amplified signals corresponding to each of the four intermediate signals. The two amplified signals corresponding to each of the four intermediate signals are coupled to first and second split inputs of four of the combiners 300 to produce four combiner output signals. The four combiner output signals are coupled to the four inputs 220–226 of the second FTM 210 to produce four final output signals at the outputs 206 of the second FTM 210.

An advantage of the network 400 over the prior-art network 200 is that in the network 400 either of the two amplifiers 402, 404 in the paths corresponding to the four intermediate signals at the outputs 212–218 can be removed from the network 400 without degrading the insertion loss and without significantly reducing the isolation between the four input signals being amplified. In fact, either one of the pairs of amplifiers 402, 404 corresponding to the four intermediate signals can be removed from all four paths corresponding to the four intermediate signals with minimal degradation of the insertion loss and without significantly reducing the isolation between the four input signals being amplified. This is true, because when one of the amplifiers 402, 404 is removed, the open circuit presented to the tee 312 of the splitter 300 through the two quarter-wave phasing lines 318, 320 or 322, 324 reflects the signal power that would have gone to the removed amplifier back to the tee 312, where it is sent to the remaining amplifier 402, 404 serving the same intermediate signal path. The output signals are essentially unaffected, provided that the remaining amplifier is able to handle the increased power.

In one embodiment, both of the split signals are amplified to produce two amplified signals corresponding to each of the four intermediate signals. The two amplified signals are then coupled to a corresponding one of the four combiners 300 to produce the four combiner output signals. In this embodiment, a failure of either amplifier 402, 404 in a given intermediate signal path will not degrade the output signals, provided that the remaining amplifier 402, 404 can handle the extra power.

In a second embodiment, both of the split signals corresponding to the four intermediate signals are amplified when traffic through the amplifier network 400 is above a predetermined threshold. The predetermined threshold can be determined, for example, from the maximum power handling capacity of one of the amplifiers. When traffic is below the predetermined threshold, only one of the two split signals corresponding to each of the four intermediate signals is amplified. This advantageously allows the amplifier network 400 to consume less power when traffic is low.

In the second embodiment, when amplifying only one of the two split signals corresponding to each of the four intermediate signals, and in response to detecting a failed amplifier, the controller 602 and the network 400 are preferably arranged and programmed to uncouple the failed amplifier and couple a stand-by amplifier to one of the two split signals not amplified prior to detecting the failed amplifier. In this way the failed amplifier advantageously can be replaced seamlessly with no disruption of service.

It will be appreciated that, while the exemplary amplifier network 400 has four inputs 204 for receiving four input signals and four outputs 206 for producing four final output signals, in the general case the amplifier network in accordance with the present invention can have N inputs and N final outputs, where N is a first integer greater than one. It will be further appreciated that, while the exemplary non-isolating splitter/combiner 300 is a two-way splitter/combiner, in the general case the splitter/combiner can be an M-way splitter/combiner and can produce and combine M split signals, where M is a second integer greater than one.

Figure 5:
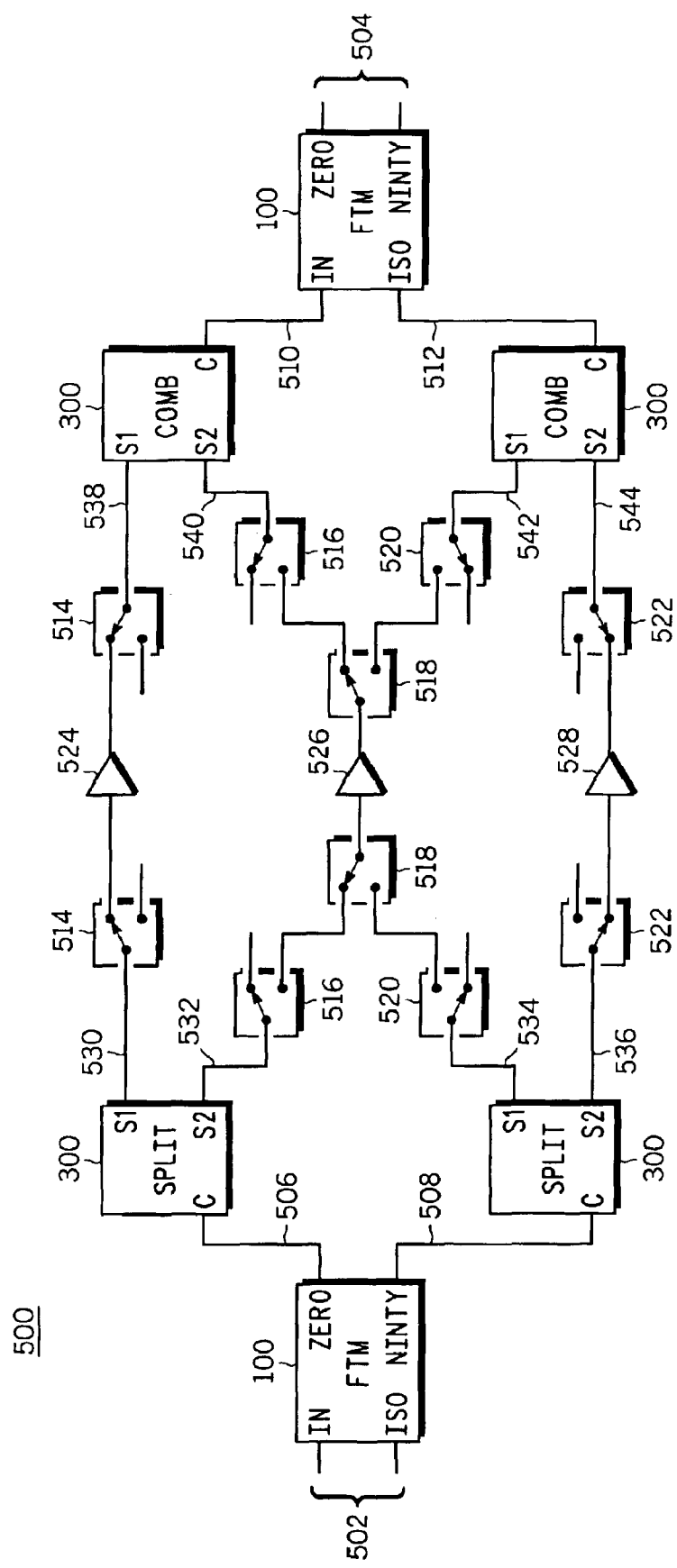
FIG. 5 is a simplified electrical block diagram of an exemplary amplifier switching arrangement in accordance with the present invention.

Referring to FIG. 5, a simplified electrical block diagram of an exemplary and inventive amplifier switching arrangement 500 comprises a first basic 2×2 FTM 100 having two inputs 502 and two outputs 506, 508 carrying first and second intermediate signals, respectively. The switching arrangement 500 further comprises first and second splitters 300 coupled, respectively, to the first and second outputs 506, 508. The first splitter 300 comprises first and second split outputs 530, 532. The second splitter 300 comprises third and fourth split outputs 534, 536. The switching arrangement 500 further comprises first and second combiners 300. The first combiner 300 comprises first and second split inputs 538, 540 and a combined output 510 coupled to a first input of a second basic 2×2 FTM 100. The second combiner 300 comprises third and fourth split inputs 542, 544 and a combined output 512 coupled to a second input of the second basic 2×2 FTM 100. The arrangement 500 also includes first and second main amplifiers 524, 528 and a stand-by amplifier 526.

Figure 6:
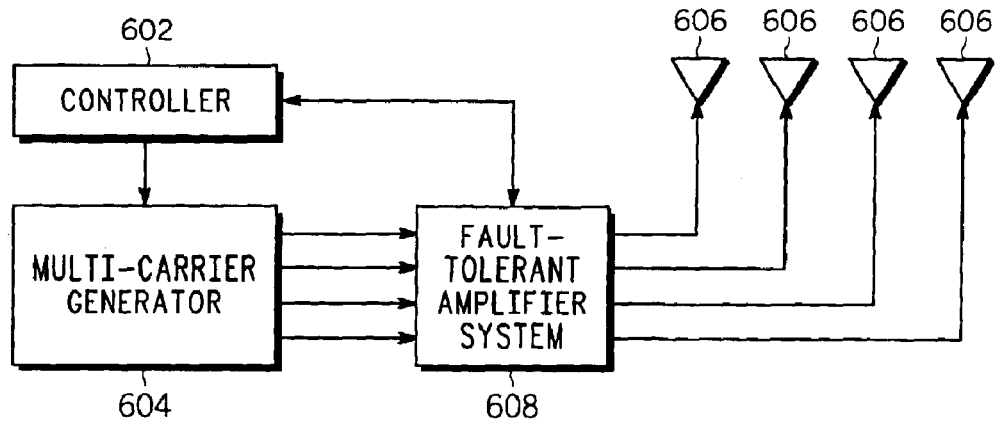
FIG. 6 is an electrical block diagram of an exemplary fault-tolerant transmitter in accordance with the present invention.

When the first and second main amplifiers 524, 528 are operative, the first split output 530 is coupled to the first split input 538 through a first controllable switch 514, the first main amplifier 524, and a second controllable switch 514. All the controllable switches of the arrangement 500 preferably comprise conventional RF relays having a single-pole, double-throw (SPDT) contact arrangement, and are preferably operated by the controller 602 (FIG. 6). The second split output 532 and the second split input 540 are each coupled to an open circuit through third and fourth controllable switches 516. Similarly, the fourth split output 536 is coupled to the fourth split input 544 through a fifth controllable switch 522, the second main amplifier 528, and a sixth controllable switch 522. The third split output 534 and the third split input 542 are each coupled to an open circuit through seventh and eighth controllable switches 520. Ninth and tenth controllable switches 518 couple the stand-by amplifier 526 to one of two paths, as needed.

When a failure of one of the first and second main amplifiers 524, 528 is detected by the controller 602 through well-known monitoring and alarm techniques, the controller 602 is arranged and programmed to remove the failed amplifier from the network and to couple the stand-by amplifier 526 between the previously-unused split output and split input of the affected splitter and combiner 300. For example, when a failure is detected in the second main amplifier 528, the controller 602 operates the fifth and sixth controllable switches 522 to remove the second main amplifier 528 from the network and to terminate the fourth split output 536 and the fourth split input 544 with open circuits.

In addition, the controller 602 operates the seventh, eighth, ninth, and tenth controllable switches 518 and 520 to couple the stand-by amplifier 526 to the third split output 534 and to the third split input 542.

The amplifier switching arrangement 500 thus advantageously can handle a failure of one of the main amplifiers 524, 528 quickly and with no degradation of insertion loss and no decrease in isolation between the signals being amplified. One of ordinary skill in the art will appreciate that the amplifier switching arrangement 500 easily can be increased to handle larger amplifier networks, such as the exemplary 4×4 FTM amplifier network 400, and/or additional stand-by amplifiers.

Referring to FIG. 6, an electrical block diagram of an exemplary fault-tolerant transmitter 600 in accordance with the present invention comprises the controller 602 for controlling the fault-tolerant transmitter. The fault-tolerant transmitter 600 further comprises a fault-tolerant amplifier system 608, including, for example, the 4×4 FTM amplifier network 400 and a switching arrangement similar in principle to the amplifier switching arrangement 500, sized to handle the 4×4 FTM amplifier network 400. The fault-tolerant amplifier system 608 is coupled to the controller 602 for control of the switching arrangement in the fault-tolerant amplifier system 608. The fault-tolerant transmitter 600 also includes a multi-carrier generator 604 coupled to the controller 602 for generating a plurality of carrier signals responsive to communication traffic handled by the transmitter 600. Outputs of the multi-carrier generator 604 are coupled to the fault-tolerant amplifier system 608, whose own outputs preferably are coupled to a plurality of RF antennas 606.

Figure 7:
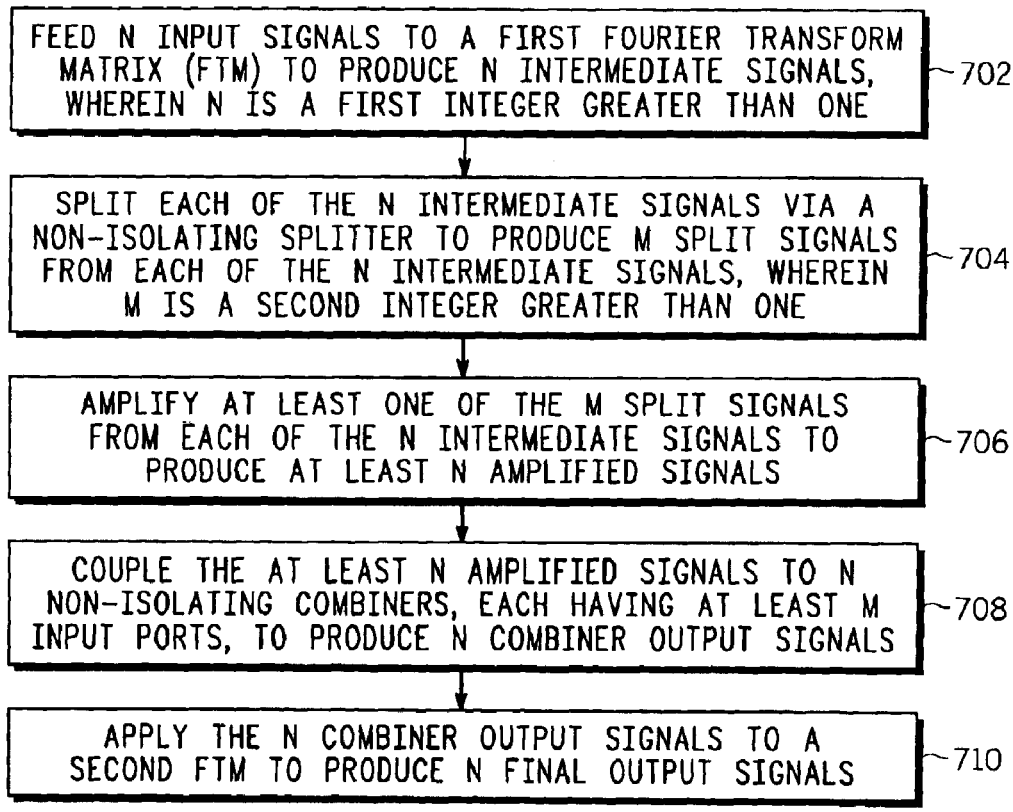
FIG. 7 is a flow diagram depicting a method for facilitating fault tolerance in an RF amplifier system.

Referring to FIG. 7, a flow diagram 700 depicting a method for facilitating fault tolerance in an RF amplifier system begins at step 702 with feeding N input signals to a first Fourier Transform Matrix (FTM) to produce N intermediate signals, wherein N is a first integer greater than one. The flow diagram 700 next includes splitting 704 each of the N intermediate signals via a non-isolating splitter to produce M split signals from each of the N intermediate signals, wherein M is a second integer greater than one. At least one of the M split signals from each of the N intermediate signals is then amplified 706 to produce at least N amplified signals. The at least N amplified signals are coupled 708 to N non-isolating combiners, each having at least M input ports, to produce N combiner output signals. The N combiner output signals are applied 710 to a second FTM to produce N final output signals.

Thus, it should be clear from the preceding disclosure that the present invention provides a method and apparatus for facilitating fault tolerance in a radio frequency amplifier system. The method and apparatus advantageously will tolerate a failure in one of a plurality of amplified paths with minimal degradation of insertion loss and without producing a substantial reduction in isolation between the RF signals being amplified.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

I claim:

1. A method for facilitating fault tolerance in a radio frequency (RF) amplifier system, the method comprising:
   feeding N input signals to a first Fourier Transform Matrix (FTM) to produce N intermediate signals, wherein N is a first integer greater than one;
   splitting each of the N intermediate signals via a non-isolating splitter to produce M split signals from each of the N intermediate signals, wherein M is a second integer greater than one;
   amplifying at least one of the M split signals from each of the N intermediate signals to produce at least N amplified signals;
   coupling the at least N amplified signals to N non-isolating combiners, each having at least M input ports, to produce N combiner output signals; and
   applying the N combiner output signals to a second FTM to produce N final output signals.

2. The method of claim 1, wherein the amplifying comprises
   amplifying all the M split signals to produce M amplified signals corresponding to each of the N intermediate signals.

3. The method of claim 2, wherein the coupling comprises
   coupling each of the M amplified signals to a corresponding one of the N non-isolating combiners to produce the N combiner output signals.

4. The method of claim 1, wherein the amplifying comprises:
   amplifying all the M split signals corresponding to each of the N intermediate signals, when traffic through the RF amplifier system is above a predetermined threshold; and
   amplifying at least one of the M split signals corresponding to each of the N intermediate signals, when traffic through the RF amplifier system is below the predetermined threshold.

5. The method of claim 4, further comprising, when amplifying the at least one of the M split signals corresponding to each of the N intermediate signals, and in response to detecting a failed amplifier, the uncoupling the failed amplifier and coupling a stand-by amplifier to one of the M split signals not amplified prior to detecting the failed amplifier.

6. The method of claim 5, further comprising
   adding phasing lines to the non-isolating splitter and to the non-isolating combiners, such that an open circuit is reflected back to a tee thereof when the failed amplifier is uncoupled.

7. An apparatus for facilitating fault tolerance in a radio frequency (RF) amplifier system, the apparatus comprising:
   a first Fourier Transform Matrix (FTM) for receiving N input signals to produce N intermediate signals, wherein N is a first integer greater than one;
   N non-isolating splitters coupled to the first FTM for splitting each of the N intermediate signals to produce M split signals from each of the N intermediate signals, wherein M is a second integer greater than one;
   a plurality of amplifiers coupled to the N non-isolating splitters for amplifying at least one of the M split signals from each of the N intermediate signals to produce at least N amplified signals;
   N non-isolating combiners coupled to the plurality of amplifiers, each of the N non-isolating combiners having at least M input ports, for producing N combiner output signals from the at least N amplified signals; and
   a second FTM for producing N final output signals from the N combiner output signals.

8. The apparatus of claim 7, wherein the plurality of amplifiers include
   M×N amplifiers for amplifying all the M split signals to produce M amplified signals corresponding to each of the N intermediate signals.

9. The apparatus of claim 8, wherein the apparatus is arranged such that
   each of the M amplified signals is coupled to one of the M input ports of a corresponding one of the N non-isolating combiners to produce the N combiner output signals.

10. The apparatus of claim 7, further comprising:
    a controller for monitoring traffic through the RF amplifier system; and
    a plurality of controllable RF switches coupled to the controller and coupled to the plurality of amplifiers,
    wherein the controller and the plurality of controllable RF switches are arranged and programmed such that:
        the plurality of amplifiers amplify all the M split signals corresponding to each of the N intermediate signals, when traffic through the RF amplifier system is above a predetermined threshold; and
        the plurality of amplifiers amplify at least one of the M split signals corresponding to each of the N intermediate signals, when traffic through the RF amplifier system is below the predetermined threshold.

11. The apparatus of claim 10, further comprising
    a stand-by amplifier coupled to the plurality of controllable RF switches, and
    wherein the controller and the plurality of controllable RF switches are further arranged and programmed such that, when amplifying the at least one of the M split signals corresponding to each of the N intermediate signals, and in response to detecting a failed one of the plurality of amplifiers, the failed one of the plurality of amplifiers is uncoupled from a corresponding one of the M split signals, and the stand-by amplifier is coupled to a corresponding one of the M split signals not amplified prior to detecting the failed one of the plurality of amplifiers.

12. The apparatus of claim 11, wherein the N non-isolating splitters and the N non-isolating combiners each comprise
    a tee; and
    a phasing line coupled to the tee, the phasing line arranged such that an open circuit is reflected back to the tee when the failed one of the plurality of amplifiers is uncoupled.

13. A fault-tolerant transmitter, comprising:
    a controller for controlling the fault-tolerant transmitter;
    a multi-carrier generator coupled to the controller for generating N input signals comprising a plurality of radio frequency (RF) carriers;
    a first Fourier Transform Matrix (FTM) coupled to the multi-carrier generator for receiving the N input signals to produce N intermediate signals, wherein N is a first integer greater than one;

N non-isolating splitters coupled to the first FTM for splitting each of the N intermediate signals to produce M split signals from each of the N intermediate signals, wherein M is a second integer greater than one;

a plurality of amplifiers coupled to the N non-isolating splitters for amplifying at least one of the M split signals from each of the N intermediate signals to produce at least N amplified signals;

N non-isolating combiners coupled to the plurality of amplifiers, each of the N non-isolating combiners having at least M input ports, for producing N combiner output signals from the at least N amplified signals; and a second FTM for producing N final output signals from the N combiner output signals.

14. The fault-tolerant transmitter of claim 13, wherein the plurality of amplifiers include M×N amplifiers for amplifying all the M split signals to produce M amplified signals corresponding to each of the N intermediate signals.

15. The fault-tolerant transmitter of claim 14, wherein the fault-tolerant transmitter is arranged such that each of the M amplified signals is coupled to one of the M input ports of a corresponding one of the N non-isolating combiners to produce the N combiner output signals.

16. The fault-tolerant transmitter of claim 13, further comprising:

a plurality of controllable RF switches coupled to the controller and coupled to the plurality of amplifiers, wherein the controller and the plurality of controllable RF switches are arranged and programmed such that:

the plurality of amplifiers amplify all the M split signals corresponding to each of the N intermediate signals, when traffic through the RF amplifier system is above a predetermined threshold; and the plurality of amplifiers amplify at least one of the M split signals corresponding to each of the N intermediate signals, when traffic through the RF amplifier system is below the predetermined threshold.

17. The fault-tolerant transmitter of claim 16, further comprising a stand-by amplifier coupled to the plurality of controllable RF switches, and wherein the controller and the plurality of controllable RF switches are further arranged and programmed such that, when amplifying the at least one of the M split signals corresponding to each of the N intermediate signals, and in response to detecting a failed one of the plurality of amplifiers, the failed one of the plurality of amplifiers is uncoupled from a corresponding one of the M split signals, and the stand-by amplifier is coupled to a corresponding one of the M split signals not amplified prior to detecting the failed one of the plurality of amplifiers.

18. The fault-tolerant transmitter of claim 17, wherein the N non-isolating splitters and the N non-isolating combiners each comprise a tee; and a phasing line coupled to the tee, the phasing line arranged such that an open circuit is reflected back to the tee when the failed one of the plurality of amplifiers is uncoupled.

* * * * *